United States Patent [19]

Le Bris et al.

[11] Patent Number: 4,954,713
[45] Date of Patent: Sep. 4, 1990

[54] DEVICE FOR CHARACTERIZING SEMICONDUCTOR SAMPLES BY PHOTOLUMINESCENCE WITH HIGH SPATIAL RESOLUTION AND AT LOW TEMPERATURE

[75] Inventors: Jean Le Bris, Quincy-Sous-Senart; Marko Erman, Paris; Gérard Gillardin, Villecresnes, all of France

[73] Assignee: U.S. Philips Corporation, New York, N.Y.

[21] Appl. No.: 377,361

[22] Filed: Jul. 7, 1989

[30] Foreign Application Priority Data

Jul. 8, 1988 [FR] France .................. 88 09296

[51] Int. Cl.$^5$ .......................................... G01N 21/64
[52] U.S. Cl. .................................................. 250/458.1
[58] Field of Search .......................... 250/458.1, 336.1

[56] References Cited

U.S. PATENT DOCUMENTS

| | | | |
|---|---|---|---|
| 3,800,161 | 3/1974 | Scott et al. | 250/564 |
| 4,786,813 | 11/1988 | Svanberg et al. | 250/461.1 |
| 4,859,063 | 8/1989 | Fay et al. | 250/418 |

FOREIGN PATENT DOCUMENTS

| | | | |
|---|---|---|---|
| 61-194307 | 8/1986 | Japan | 250/458.1 |
| 61-290311 | 12/1986 | Japan | 250/458.1 |
| 62-263451 | 11/1987 | Japan | 250/458.1 |
| 1029053 | 12/1979 | U.S.S.R. | 250/458.1 |

Primary Examiner—Constantine Hannaher
Assistant Examiner—J. Eisenberg
Attorney, Agent, or Firm—Paul R. Miller

[57] ABSTRACT

A device is described for characterizing wafers of semiconductor materials by photoluminescence with high spatial resolution and at low temperature, this device comprising at least:
(a) a cryostatic vacuum chamber provided with a cooled sample carrier adapted to receive the wafer and provided with at least one window for the transmission of the light beams implied in the photoluminescence process;
(b) optical means for forming a luminous spot on the wafer from a laser beam and for transmitting the re-emitted photoluminescence beam to a detector, characterized in that the optical means comprise first optical means for forming on the wafer from the laser beam a wide unfocused luminous spot and second optical means with high resolution for forming with a magnification exceeding unity on the receiving surface of the detector the image of photoluminescence of the surface of the luminous spot, and in that the detector is apt to produce a digitized image thereof.

22 Claims, 1 Drawing Sheet

U.S. Patent  Sep. 4, 1990  4,954,713
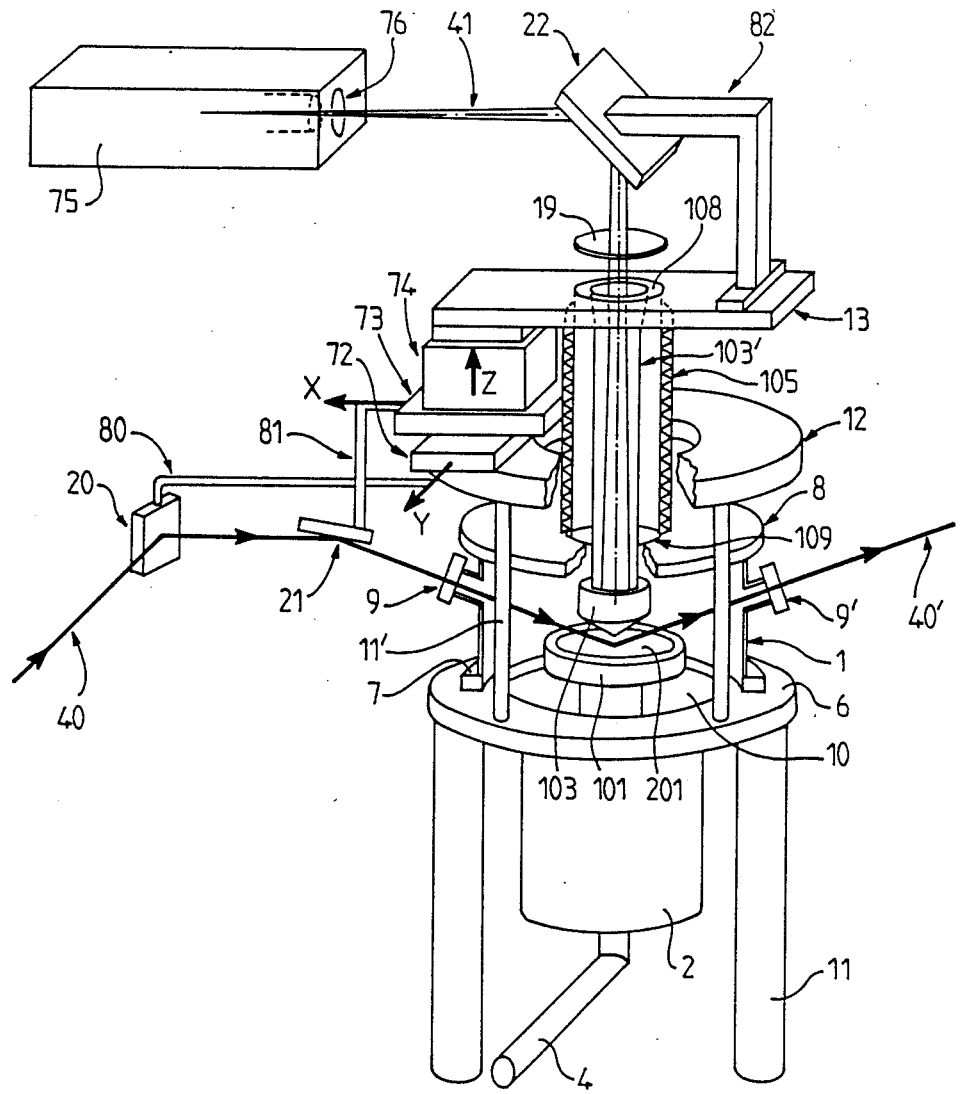

DEVICE FOR CHARACTERIZING SEMICONDUCTOR SAMPLES BY PHOTOLUMINESCENCE WITH HIGH SPATIAL RESOLUTION AND AT LOW TEMPERATURE

The invention relates to a device for characterizing wafers of semiconductor materials by photoluminescence with high spatial resolution and at low temperature, this device at least comprising:

(a) a cryostatic vacuum chamber provided with a cooled sample carrier adapted to receive the wafers and provided with at least one window for the transmission of the light beams implied in the photoluminescence process;

(b) optical means for forming a luminous spot on the wafer from a laser beam and for transmitting the re-emitted photoluminescence beam to a detector.

The invention is used in the examination of the distribution of inherent defects and of the impurities associated with the dislocations in the undoped semiconductor crystals and in the examination of the uniformity and the concentration of the dopants in the doped semiconductor crystals.

A device for characterizing samples by photoluminescence with high spatial resolution is already known from the publication entitled "Photoluminescence measurement in GaAs with high spatial resolution" by Tsuguru Shirakawa et al. in Jpn. J. Appl. Phys. Vol. 24 (1985) No. 11, pp. 1565-1566.

Another device for characterizing samples by photoluminescence with high spatial resolution is also known from the publication entitled "Photoluminescence at dislocations in GaAs and InP" by K. Böhm and B. Fischer in J. Appl. Phys. 50 (8), August 1979, 1979 American Institute of Physics, pp. 5453-5460.

In accordance with one or the other of these known devices, the sample to be characterized is held in a small cryostatic vacuum chamber, which is provided with a single window.

A microscope is used two times: a first time for focusing a laser beam on the surface to be examined of the cooled sample arranged in the cryostatic chamber; and a second time for transforming the photoluminescence beam re-emitted by the sample at a wavelength different from that of the incident beam into a parallel beam.

The microscope being situated outside the cryostatic vacuum chamber, both the incident beam and the re-emitted beam are convergent when they traverse the window of the cryostatic chamber.

The incident laser beam is arranged in the axis of the microscope by means of a semi-reflecting plate and the re-emitted beam is arranged, after having traversed the microscope, in a monochromator by means of a reflecting plate situated beyond the semi-reflecting plate in the path of the re-emitted beam in the axis of the microscope.

At the output of the monochromator, a detector transmits the informations to a data processing system.

In order to permit that the sample wafer is scanned by the incident laser beam, the cryostat assembly is placed on an X-Y displacement platform. Thus, the dimension of the window of the cryostat and the dimension of the sample wafer must be of the same order of magnitude.

Since on the other hand it has appeared that the beams traversing the window of the cryostat are convergent, the thickness of this window, which is a plate having parallel surfaces, must be as small as possible so that these convergent beams are disturbed to the least possible extent.

However, other conditions are imposed on this window due to the fact that it closes the vacuum chamber. In order to maintain vacuum conditions, the thickness of this window must be larger as its diameter is larger.

Therefore, due to the fact that the device according to the prior art is designed so that the beams traversing the window of the cryostatic vacuum chamber are convergent, this device has the following disadvantages:

The window has a small thickness, which results in that it has a small diameter, which involves that the maximum diameter of the samples which can be characterized by means of this device must also be small.

On the other hand, due to the fact that the cryostat assembly must be displaced to scan the sample by the luminous spot and that the luminous spot by the incident beam is small, the speed at which the measurements are carried out is low.

However, a much more serious disadvantage is added to these disadvantages, which is associated with the principle itself of photoluminescence image formation.

As already stated above, the microscope has to form from a substantially parallel laser beam a small focused spot on the surface to be examined. Subsequently, the microscope again receives the light re-emitted by this small spot. The spatial resolution of the device therefore depends upon the diameter of this spot all the time the spot has a dimension larger than the diffusion length of the minoritary charge carriers in the wafer to be examined. Since this microscope is a lens microscope, the luminous spot cannot be smaller than 2 $\mu$m. It is then of the same order as the diffusion length and consequently can limit the resolution. Therefore, this device does not permit attaining the maximum resolution.

Finally, such a lens microscope can open only a large spectral range. In fact, the more the microscope operates at the level of the diffraction limit, the narrower is the spectral range in which it operates due to the dispersion of the index of glass, i.e. to its variation as a function of the wavelength.

Now, for the examination of the semiconductor materials by means of laser sources, whose wavelengths can lie in the square wave range of 0.51 $\mu$m to 1.06 $\mu$m, the wavelengths of photoluminescence can vary between 0.8 $\mu$m and 1.6 $\mu$m. The wavelength of photoluminescence in fact depends upon the compound examined, upon the dopants, upon the impurities, etc. It is therefore necessary that a large spectral range is available for examining the envisioned semiconductor materials, and evidently the devices known from the prior art cannot solve the problem of both the high resolution and the large spectral range.

Moreover, the examination of semiconductor materials by photoluminescence with high resolution can yield the expected results only if the sample is arranged in vacuo and at very low temperature (of the order of 10° K.).

The invention has for its object to provide a device for characterizing samples by photoluminescence, which permits solving all these problems.

More particularly, the invention has for its object to provide a device, which permits carrying out measurements in the required vacuum at temperatures down to 10° K. and on large samples of at least "2 inches" ($\approx$5 cm) to "4 inches" ($\approx$10 cm).

The invention has also for its object to provide a device, which permits carrying out these measurements with a better spatial resolution.

The invention further has for its object to provide a device, which permits carrying out these measurements at a higher speed.

The invention moreover has for its object to provide a device, which operates at the diffraction limit and over a wide spectral range.

According to the invention, these objects are achieved by means of a device provided with the elements mentioned in claim 1 and moreover characterized in that the optical means comprise first optical means for forming on the wafer from the laser beam a wide unfocused luminous spot and second optical means with high resolution for forming with a magnification exceeding unity on the receiving surface of the detector the photoluminescence image of the surface of the luminous spot, and in that the detector is apt to supply a digitized image thereof.

In an advantageous embodiment, the first optical means comprise a flat mirror system arranged in the path of the incident laser beam so that this unfocused laser beam is transmitted with oblique incidence on the surfaces of the wafer through a first window of the vacuum chamber and so that a wide luminous spot is thus formed.

In a preferred embodiment, the second optical means comprise a catadioptric optical system comprising mirrors having a large numerical aperture arranged in the path of the photoluminescence beam and operating at the diffraction limit so that from a large central zone of the surface to the luminous spot considered as object an image beam is formed quasi parallel to the wavelength of the photoluminescence with a large magnification.

In this preferred embodiment, the device is such that the catadioptric optical system comprising mirrors is arranged within the vacuum chamber, and in that the quasi parallel beam of photoluminescence is transmitted to the receiving surface of the detector through a second window of the vacuum chamber.

In order that the invention may be readily carried out, it will now be described more fully with reference to the accompanying diagrammatic the FIGURE.

First reference is made to the principle of forming photoluminescence images.

A pump beam, i.e. a laser beam, illuminating the surface of semiconductor material is absorbed and generates electron-hole pairs. Each pair slightly diffuses into the material and thus loses a little energy, but has a probability not equal to zero of being recombined to produce a photon.

Then there is emission of a photoluminescence beam, whose wavelength $\lambda$ is different from the wavelength $\lambda_o$ of the laser beam due to the loss of energy by diffusion before recombination.

The energy lost in the material is not insignificant and the final recombination energy is characteristic of the material, but also of the impurities, of its doping, of the alloy constituting it, etc.

When the temperature of the material is decreased, the photoluminescence efficiency increases. Especially, if the value of the intensity of the photoluminescence beam as a function of the wavelength at the ambient temperature is considered, a curve is obtained showing a maximum, whose value at half-intensity is large. On the contrary, at low temperature, this curve shows narrow peaks corresponding, for example, to the impurities or to given constitutive elements of the material.

The characterization at low temperature by the photoluminescence method therefore permits, for example, the chemical analysis of the material.

Two types of characterization by photoluminescence can be obtained. The first consists in a general mapping of the sample to be examined, this mapping then being realized with low resolution. This mapping method is known, for example, from the publication entitled "Computer-Controlled Mapping of Photoluminescence Intensities" by Masamichi Yokogawa, et al. in "Jpn. J. Appl. Phys. Vol. 23 (1984), No. 5, p. 663".

The second type of characterization with high resolution consists in that only a relatively small surface of the sample is considered during each measurement.

According to the two publications mentioned as prior art in the preamble, it was even attempted to form a very small luminous spot, of the order of 2 $\mu$m, by the laser beam, the dimension of the luminous spot then fixing the limit of resolution.

According to the invention, on the contrary, a large luminous spot will be formed by the laser beam. This large luminous spot is obtained in that the unfocused laser beam obliquely incident upon the sample is conducted. Thus formed, the luminous spot is of the order of 2 mm×5 mm. In the proximity of the center of the luminous spot, a zone having dimensions of 300 $\mu$m×300 $\mu$m is chosen.

This zone of 300 $\mu$m×300 $\mu$m serves as an object for a high-resolution optical system, which projects its image onto the sensitive surface of a camera capable of supplying a digitized image.

This high-resolution optical system is a catadioptric optical mirror system having a large numerical aperture, which operates at the limit of the diffraction.

Moreover, this optical system is arranged so that there are no glass windows between the optical system and the sample.

In fact, if an optical system operating at the limit of the diffraction includes glass lenses or is separated from the sample by a glass window, the spectral range in which the optical system can operate becomes very narrow due to the dispersion of the index of the glass.

According to the invention, the sample is arranged in a cryostatic vacuum chamber to permit the sample to be cooled in order to obtain the advantages of characterization of the elements of the material mentioned above and, in order to avoid that the beam traverses a glass window, as was known from the prior art, on the one hand the optical system is of the type comprising mirrors and on the other hand the optical system is arranged in the interior itself of the cryostatic vacuum chamber.

Thus, it becomes possible to utilize a laser radiation whose wavelength can be 0.51 $\mu$m (Ar) or 1.6 $\mu$m (YAG) depending upon the physical system to be examined, which leads to obtaining for the semiconductors a photoluminescence radiation whose wavelength can vary from 0.8 $\mu$m to 1.6 $\mu$m depending upon the alloy. According to the invention, it can thus be operated in a large spectral range.

The fact that the optical system is arranged in the interior of the cryostatic vacuum chamber results in that the beam leaving the optical system and traversing a window of the cryostatic vacuum chamber is at this area practically parallel. It is therefore not disturbed by the passage through the glass window. As has been seen, this was quite different in the known devices, in which the window was interposed on a strongly divergent photoluminescence beam as well as on the illumination laser beam, which was also divergent at this area.

According to the invention, a region of 300 μm×300 μm of the sample is therefore projected by means of this optical system onto the sensitive surface having a diameter of about 25 mm (1 inch) of a camera, for example of the C.C.D. type, or of any other detector capable of processing a parallel information. This method permits carrying out the characterization much more rapidly than according to the prior art, in which a surface had to be scanned by means of a point of 2 μm.

Here, the quality of the image projected by the optical system has a resolution of 1 μm. The magnification obtained at the level of the sensitive surface of the camera is about 60. The camera supplies a digitized image, which can be optimally 1024 points×1024 points.

Therefore, on a line of 300 μm, the photoluminescence is collected every 0.3 μm.

As has been stated, the optical system comprising mirrors distinguishes only details of 1 μm. By collecting the photoluminescence every 0.3 μm, "oversampling" is therefore obtained. Thus, more points are collected than is necessary from the viewpoint of conventional signal processing. This method has the advantage that it permits more satisfactorily noise suppression".

On the other hand, due to the diffusion of the photogenerated charge carriers, i.e. electron-hole pairs, which diffusion is higher than 1 μm, a local disturbance (for example an impurity, a dopant, etc.) of the semiconductor will produce a photoluminescence signal which will also extend over more than 1 μm. Therefore, the resolution of the optical system will not limit the resolution of the photoluminescence image.

Moreover, such a high resolution of the optical system will be used to visualize the technology patterns present at the surface of the semiconductor sample, some of these patterns lying in the submicron range. A resolution of up to 1 μm is therefore not superfluous.

By means of the FIGURE, a preferred embodiment of the invention will be described hereinafter.

As shown in the FIGURE, the device according to the invention first comprises a vacuum chamber 1 provided with a lower base plate 7 and with an upper base plate 8. The vacuum chamber 1 can favourably be cylindrical and bear on the support 6 by its lower base plate 7 provided with a vacuum-tight joint.

The vacuum chamber comprises two lateral windows 9 and 9', i.e. the first window 9 for permitting the introduction of the incident laser beam 40 and the second window 9' for allowing the laser 40' reflected by the sample 201 to exit.

The vacuum chamber further comprises an opening 10 provided in the support 6. Through this opening 10, the sample carrier 101 provided with the sample 201 connected to the cryostat 2 can be introduced. The cryostat 2 comprises an inner serpentine, which can be fed with liquid helium through the inlet 4. A pump not shown permits the circulation of the liquid helium in the serpentine. The liquid helium leaves the cryostat through a second nozzle not shown in the FIGURE. The sample carrier favourably consists of copper. It is moreover provided with a thermocouple not shown to permit measuring its temperature. The sample of semiconductor material or even the integrated circuit wafer arranged at 201 at the surface of the sample carrier can therefore be cooled by this system to about 10° K.

For carrying out the invention, use can be made of a cryostat commercially available, for example the cryostat "helium type Bidon" of the Company SMC TBT (France). For forming the windows 9 and 9', "soldering inspection ports" can be used having a diameter of 40 mm, "reference HV 40 S" of the Company SVT (France).

The inspection ports 9 and 9' are arranged laterally on the vacuum chamber 1 in such a manner that the incidence angle of the laser beam 40 is of the order of 70°.

The support 6 of the vacuum chamber and of the cryostat can be fixed on an optical bench or surface plate by means of the fixing members 11. The cryostat is in turn mounted in a vacuum-tight manner on the support 6.

The means for establishing a vacuum in the vacuum chamber 1 are not shown in the FIGURE for the sake of clarity of the drawing.

The vacuum chamber 1 further has an opening 109 provided in the upper base plate 8. This opening 109 made sufficiently large to permit the X,Y displacement, which is mentioned below, permits the passage of a hollow tube 103' serving as an objective carrier, at whose lower end the catadioptric optical system 103 is fixed and thus held above the sample 201. The upper part of the objective carrier 103' is made integral with the support 13.

Metallic bellows 105 connect in a vacuum-tight manner the support 13 to the base plate 8. The vacuum-tightness with respect to the vacuum chamber of the support 13 is obtained through a window 108, which permits the passage of the beam transported by the optical system 103.

A support 12 is made integral with the support 6 by fixing members 11'. On this support 12 a micromanipulator having three degrees of freedom X, Y and Z is fixed, of which the last platform 74 performing the movement Z is made integral with the support 13. In these conditions, the support 13 can be subjected to the movements parallel to X by the platform 73, to the movements Y by the platform 72 and to the movements Z by the last platform 74. These movements are transmitted by the support 13 and the objective carrier 103' for the optical system 103, which can thus be displaced in the directions X and Y parallel to the plane of the sample 201 and in the direction Z for positioning. The bellows 105, the upper part of which is displaced simultaneously in the same directions and over the same distances, permit maintaining a vacuum in the vacuum chamber 1 when the optical system is displaced with respect to the sample. For this purpose, metallic vacuum-tight bellows of 60 waves can be procured from the Company CALORSTAT (France).

The translations X,Y,Z can be obtained by means of devices commercially available. Especially, the translations X and Y can be obtained by means of two reference platforms "UT 100 PP" of the Company MICROCONTROLE (France), and the vertical translatory movement Z can be obtained by means of a platform "MV 80" of the Company MICROCONTROLE (France).

As can be seen, according to the invention, the optical system 103 transporting the photoluminescence beam 41 is displaced with respect to the sample, the latter and the vacuum chamber being fixed, in contrast with what was the case in the prior art devices.

By these displacements, the optical system is apt to observe the sample at any area of its surface to the extent to which each surface part observed is excited by the laser beam. For this purpose, the laser beam 40 is conducted over the sample 201 after two reflections on the mirrors 20 and 21. These mirrors are arranged so that, by connecting the first mirror 20 by the fixing means 80 to the movement Y of the platform 72 and by connecting the other mirror 21 by the fixing means 81 to the movement X of the platform 73, the luminous spot produced by the laser beam at the surface of the sample is displaced exactly in the same directions and proportions as the objective of the catadioptric optical system 103.

It can be seen that in these conditions the laser beam 40 is not focused. It forms a wide spot (2×5 mm) on the sample.

The catadioptric optical system 303 is arranged so that a surface area of 300 μm×300 μm in the luminous spot is observed. As catadioptric optical system comprising mirrors having a large numerical aperture, use can be made of an optical system commercially available, for example "Planopochromat 40/0,5, focus 6.3 mm, catadioptric" of the Company ZEISS. It supplies a resolution of 1 μm.

The photoluminescence beam 41 leaving the optical system 103 traversing the window 108 while it is practically parallel is not disturbed by the glass of said window. It can therefore have a diameter sufficiently large and especially sufficiently thick to maintain a vacuum.

Leaving the vacuum chamber through the window 108, the photoluminescence beam traverses further a filter 19 serving to cut the light having the wavelength of the laser beam and only transmit the light having the wavelength of photoluminescence.

Subsequently, the photoluminescence beam 41 is directed by means of the mirror 22 towards the sensitive surface 76 of the camera 75, at which it will form an image of about 18×18 mm. This mirror 22 is integral with the support 13 by the fixing means 82 and is arranged so that it follows the movements of this support 13. In order that the image of the area observed by the optical system on the sample is formed fixedly on the surface 76, the camera 75 also follows the movements X,Y,Z by a device not shown in the FIGURE.

The digital camera apt to treat the photoluminescence beam so as to produce therefrom a digitized image, as already stated above, can be a camera commercially available, such as "C 1000, type 02" of the Company HAMAMATSU (Japan).

The data are transmitted by means of a control unit on the hand to a computer (for example PDP 11.73 of the Company DIGITAL EQUIPMENT CORPORATION) in the direct memory access (DMA) mode and on the other hand to a video screen. The typical duration required for the acquisition of an image of 1024×1024 points is 30 seconds.

Finally, the movements X,Y,Z can be motorized in order to automatize the recording.

The laser sources may be, for example:
an argon laser from SPECTRA PHYSICS "Model 165",
a YAG laser from MICROCONTROLE, Model "YAG 904" (French Company).

A HeNe laser can be used to obtain the preliminary alignment of the assembly of the optical system in order to attain the object of displacing simultaneously the luminous spot, whose position depends upon the orientation and upon the position of the mirrors 20 and 21 and the optical system 103, the mirror 22 and the camera 75, upon which depends the fixation of the image on the surface 76 of the camera 75.

The choice of the laser sources depends upon the samples subjected to the characterization.

We claim:

1. A device for characterizing wafers of semiconductor materials by photoluminescence with high spatial resolution and at low temperature, this device comprising at least:
   (a) a cryostatic vacuum chamber provided with a cooled sample carrier adapted to receive the wafers and provided with at least one window for the transmission of the light beams implied in the photoluminescence process;
   (b) optical means for forming a luminous spot on the wafer from a laser beam and for transmitting the re-emitted photoluminescence beam to a detector, characterized in that the optical means comprise first optical means for forming on the wafer from the laser beam a wide unfocused luminous spot and second optical means with high resolution for forming with a magnification exceeding unity on the receiving surface of the detector the photoluminescence image of the surface of the luminous spot, a device characterized in that said optical means comprise a catadioptric optical system comprising mirrors having a large numerical aperture arranged in the path of the photoluminescence beam and operating at the diffraction limit so that from a large central zone of the surface to the luminous spot considered as an object a quasi parallel image beam is formed at the wavelength of the photoluminescence with a large magnification and in that the detector is apt to supply a digitized image thereof.

2. A device as claimed in claim 1, characterized in that the said first optical means comprise a flat mirror system arranged in the path of the incident laser beam so that this unfocused laser beam is transmitted with oblique incidence to the surface of the wafer through a first window of the vacuum chamber and so that thus a wide luminous spot is formed.

3. A device as claimed in claim 2, characterized in that the catadioptric optical system comprising mirrors is arranged within the vacuum chamber, and in that the quasi parallel beam of photoluminescence is transmitted to the receiving surface of the detector through a said second window of the vacuum chamber, this window being fixed in a said support.

4. A device as claimed in claim 3, characterized in that the said second optical means moreover comprise for transmission of the beam of photoluminescence to the receiving surface of the detector once emitted from the cryostatic vacuum chamber a flat mirror system arranged in the path of the beam.

5. A device as claimed in claim 4, characterized in that the said second optical means further comprise for elimination of the radiations having wavelengths different from the wavelength of photoluminescence a filter arranged in the path of the beam between the cryostatic vacuum chamber and the detector.

6. A device as claimed in claim 5, characterized in that it comprises mechanical means for carrying out the relative displacement of the wafer and the optical means.

7. A device as claimed in claim 6, characterized in that the mechanical displacement means are applied to the optical means as well as to the detector, the other parts of the device remaining fixed.

8. A device as claimed in claim 7, characterized in that the mechanical means cooperate with each other in order to obtain the simultaneous displacement in distance and in direction of the first and second optical means in two directions X and Y parallel to the plane of the sample wafer and the displacement of the detector.

9. A device as claimed in claim 8, characterized in that said mechanical means cooperate with each other in order to permit the displacement of the said second optical means in a direction Z at right angles to the plane of the wafer and the displacement of the detector.

10. A device as claimed in claim 9, characterized in that the optical means comprise a platform having three degrees of freedom fixed to the support of the said second window.

11. A device as claimed in claim 10, characterized in that the movements of displacement are transmitted to the catadioptric optical system in the vacuum chamber by means of an objective carrier integral with the support of the second window, and in that, in order to maintain a vacuum during displacements, vacuum-tight bellows connect the said support of the second window to the body of the cryostatic vacuum chamber.

12. A device as claimed in claim 11, characterized in that, in order to obtain the simultaneous displacement of the first and the second optical means, the said first optical means are constituted by two flat mirrors arranged in the path of the incident laser beam, each of these mirrors being integral with a mechanical part of the platform having three degrees of freedom so as to be connected with a movement parallel to one of the respective directions X or Y in order to obtain the displacement of the luminous spot at the surface of the wafer over a given distance in these directions X or Y.

13. A device as claimed in claim 12, characterized in that in the said second optical means the system for returning the photoluminescence beam is constituted by a flat mirror, and in that said second optical means and the detector are connected to the said support of the second window, through which the movements X and Y are transmitted thereto so as to follow the displacements of the luminous spot and the movement Z so as to permit the positioning of the catadioptric optical system.

14. A device as claimed in claim 1, characterized in that the sample carrier is connected to a cryostat which permits of obtaining the cooling of the wafer carrier, this cryostat being integral with the vacuum chamber in order to maintain a vacuum in the said chamber.

15. A device as claimed in claim 14, characterized in that the cryostat operates with liquid helium and permits of obtaining temperatures of the sample wafer of the order of 10° K.

16. A device as claimed in claim 15, characterized in that, in order to obtain the cooling of the sample carrier and of the sample by liquid helium, the cryostat comprises a serpentine, in which the circulation of liquid helium is obtained by means of a pump.

17. A device as claimed in claim 1, characterized in that, in order to control the temperature of the sample, the sample carrier is provided with a thermo-couple.

18. A device as claimed in claim 1, characterized in that the sample carrier consists of copper.

19. A device as claimed in claim 1, characterized in that the detector is a digital camera of the C.C.D. type, whose data are transmitted to a computer and to a video screen.

20. A device as claimed in claim 6, characterized in that the mechanical means are motorized.

21. A device as claimed in claim 1, characterized in that the incident laser beam originates from a source chose among an argon laser or a YAG laser permitting of obtaining incident radiations having wavelengths of 0.51 $\mu$m and 1.06 $\mu$m, respectively.

22. A device as claimed in claim 1, characterized in that the source used to obtain the optical alignment is a helium-neon laser.

* * * * *